United States Patent [19]

Morita et al.

[11] Patent Number: 4,977,024

[45] Date of Patent: Dec. 11, 1990

[54] MAGNESIA GRANULE COATED WITH SILICA OR FORSTERITE

[75] Inventors: Mitsuhiko Morita; Yasuhiko Toda; Tetuo Yamamoto, all of Ube, Japan

[73] Assignee: Ube Industries, Ltd., Yamaguchi, Japan

[21] Appl. No.: 201,766

[22] Filed: Jun. 2, 1988

[30] Foreign Application Priority Data

Jun. 19, 1987 [JP] Japan .................................. 62-151053

[51] Int. Cl.$^5$ ............................................. B32B 18/00
[52] U.S. Cl. ..................................... 428/404; 427/215
[58] Field of Search ....................... 428/403, 404, 405; 501/108, 122; 427/213, 215

[56] References Cited

U.S. PATENT DOCUMENTS

| | | | |
|---|---|---|---|
| 4,677,026 | 6/1987 | Hamamoto et al. | 428/404 |
| 4,766,162 | 8/1988 | Hamamoto et al. | 523/440 |
| 4,781,982 | 11/1988 | Musselman et al. | 428/403 |
| 4,789,510 | 12/1988 | Toda | 264/60 |

Primary Examiner—George F. Lesmes
Assistant Examiner—Christopher Brown
Attorney, Agent, or Firm—Burgess, Ryan & Wayne

[57] ABSTRACT

A magnesia granule having a surface covered with a continuous and uniform coating of silica or forsterite, and suitable for use as a filler. The magnesia granule is prepared by a process comprising granulating a magnesia powder into a spherical shape, heat treating the granular particles at a temperature in a range of from 1400° C. to 1700° C. for not more than 1 hour, and then subjecting the particles to gas-solid phase mixing with a heated vapor of an organic silicate compound in a fluidized bed reactor to cover the surface of the granular magnesia particles with a continuous and uniform coating of silica, or a process comprising granulating a magnesia powder of particles coated with a silica layer into a spherical shape, and then heat treating the granular particles at a temperature in a range of from 1400° C. to 1700° C. for not more than 1 hour to cover the surface of the granular particles with a continuous and uniform coating or forsterite.

4 Claims, 3 Drawing Sheets

20μm

20μm

20μm

20μm

20μm 4,977,024

MAGNESIA GRANULE COATED WITH SILICA OR FORSTERITE

BACKGROUND OF THE INVENTION

1. Field of the Invention

The present invention relates to a magnesia granule and a process for the production thereof. The magnesia granule of the present invention is useful as a filler of a resin composition for sealing electronic parts or the like, has an excellent thermal conductivity, resistance to deterioration, and insulating properties, and does not emit o rays, which may cause operation errors in semiconductor elements.

2. Description of the Related Art

Hitherto, crystalline silica and fused silica have been used as a filler of a resin composition for sealing electronic parts, but since electronic parts are now highly integrated with semiconductor elements and the like, thus drastically increasing the quantity of generated heat, silica can not sufficiently dissipate this heat due to a relatively low thermal conductivity thereof. Furthermore, silica has a drawback in that, since the hardness thereof is high, a resin-sealing material containing silica causes serious wear of a molding machine and mold during resin-sealing by transfer molding or injection molding.

As a filler material capable of overcoming these drawbacks, magnesia is receiving great attention due to the high thermal conductivity and low hardness thereof, but magnesia has the following drawbacks, which impede the practical use thereof.

(1) A magnesia powder prepared by pyrolytically decomposing a magnesium salt synthesized by using a magnesium ion in seawater as a starting material, and then powdering the decomposed material, contains uranium and thorium in an amount as high as several hundred ppb. Therefore, the magnesia powder cannot be used as desired because the sealed storage elements cause operation errors due to $\alpha$ rays emitted from the uranium and thorium. Furthermore, the magnesia powder prepared by pyrolytic decomposition has a great tendency to secondarily agglomerate and exhibits an unsatisfactory dispersion when incorporated into a resin.

(2) A magnesium powder prepared by gas phase oxidation of a heated vapor of metallic magnesium can have a reduced content of uranium and thorium of as low as about 1 ppb, and has an excellent dispersibility, but since the powder is prepared by a build-up process, it is difficult to obtain coarse particles, and thus a powder of particles having an average particle size of several micrometers or more cannot be prepared. Therefore, since the powder has a fine particle size, it is difficult to handle and to satisfactorily effect the incorporation thereof with a resin.

(3) If a magnesia powder prepared by the gas phase oxidation is granulated into a particle size of several tens of micrometers by a conventional method such as spray drying, the handling properties can be improved, but the granular particles are broken during the incorporation with a resin and become dispersed in the resin as the primary particles of the starting powder, to strikingly increase the viscosity, and thus the incorporating operation becomes very difficult or even impossible.

(4) Magnesia is relatively easily hydrated by moisture in air and converted into magnesium hydroxide, and therefore, when incorporated with a resin, the conversion into magnesium hydroxide is caused by moisture permeating into the resin from the air, to cause cracks in the resin due to a volume expansion of the magnesia due to the conversion into magnesium hydroxide, thereby degrading the long term reliability of the sealed electronic parts.

SUMMARY OF THE INVENTION

To overcome the above-mentioned difficulties, the present invention is primarily aimed at providing a magnesia granule containing very slight amounts of uranium and thorium, having a shape, particle size distribution, and strength suitable as a filler of a resin composition for sealing electronic parts or the like, and having a high resistance to hydration.

Another object of the present invention is to provide a process for the production of such a magnesia granule.

The above-mentioned objects of the present invention can be realized according to the present invention as described below.

The present invention provides a magnesia granule the surface of which is covered with a continuous and uniform coating of silica or forsterite.

The magnesia granule of the present invention having the silica coated surface is prepared according to a process comprising, granulating a magnesia powder into a spherical shape, heat treating the granular particles at a temperature in a range of from 1400° C. to 1700° C. for not more than 1 hour, and then subjecting the particles to gas-solid phase mixing with a heated vapor of an organic silicate compound in a fluidized bed reactor to cover the surface of the granular magnesia particles with a continuous and uniform coating of silica.

Further, in accordance with the present invention, the magnesia granule having the forsterite coated surface is prepared according to a process comprising, granulating a magnesia powder of particles coated with a silica layer into a spherical phase, and then heat treating the granular particles at a temperature in a range of from 1400° C. to 1700° C. for not more than 1 hour to cover the surface of the granular particles with a continuous and uniform coating of forsterite.

DESCRIPTION OF THE PREFERRED EMBODIMENTS

Figure 1:
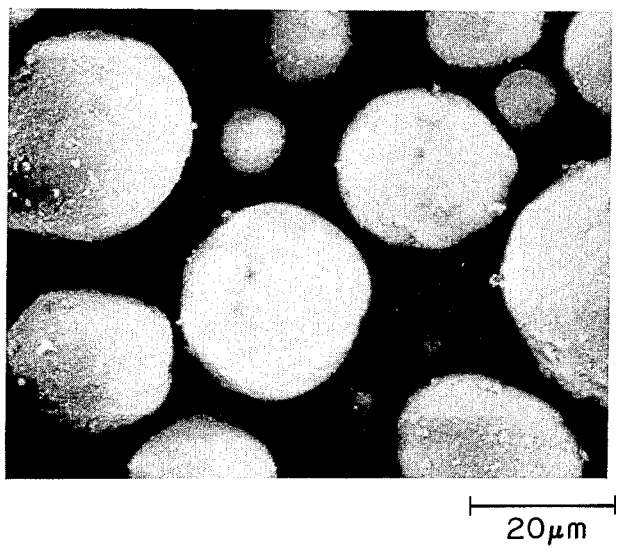
FIG. 1 is a micrograph of a magnesia granule obtained after the heat treatment in Example 1.

In accordance with the present invention, a magnesia powder obtained by gas phase oxidation of a heated vapor of metallic magnesium, e.g., as described in Japanese Unexamined Patent Publication (Kokai) Nos. 59-213619 and 60-161327, is admixed with an organic solvent such as ethanol and, optionally, a binder such as polyvinyl butyral is added to the mixture. The resulting slurry is spray dried on a spray dryer in a known manner, to produce spherical granular particles. Although various known granulation methods such as a rolling granulation method, mixed stirring granulation method, and fluidized bed granulation method may be employed for the granulation, the granulation method on a spray dryer is most suitable for obtaining spherical granular particles having a narrow particle size distribution and a particle size of several tens of micrometers, and suitable for incorporation with a resin. The size of the granular particles may be controlled as desired by regulating the operation conditions of the spray dryer, and therefore, granular particles having a size of 1 to 40 micrometers are preferred as a filler.

Then, the granular particles may be heat treated in an electric furnace to obtain granular particles having a high strength. The heat treatment may be carried out by using a static electric furnace or fluidized bed electric furnace, but a fluidized bed electric furnace is preferred, since in this furnace little thermal adhesion occurs between the granular particles. The heat treatment conditions may vary depending on properties such as particle size of the starting magnesia powder, but it is generally preferable to effect the heat treatment at 1,400° C. to 1,700° C. for not more than 1 hour. Where the heat treatment temperature is lower than 1,400° C., the heat treatment must be conducted for a long period of time to obtain strong granular particles, and as the heat treatment time lengthens, thermal adhesion between the granules is undesirably increased. Where the heat treatment temperature is higher than 1,700° C., thermal adhesion between the particles is caused over a short period of time, and thus it becomes difficult to obtain granular particles which can be well dispersed. Where the granular particles are incorporated with a resin for sealing electronic parts without being heat treated, the particles are broken during the incorporation with a resin and dispersed into the resin as the primary particles of the starting powder, to remarkably increase the viscosity of the mass and thereby make the incorporation difficult or even impossible. A magnesia filler suitable for incorporation with a resin can be obtained according to the above-mentioned procedure. To enhance the resistance to hydration of the magnesia filler, it is possible to utilize a previous invention by the present applicant, as disclosed in U.S. Pat. No. 4,677,026.

The resistance to hydration thus can be provided according to the following two processes.

(1) The magnesia granule granulated and heat treated as mentioned above and a heated vapor of an organic silicate compound, the concentration of which has been adjusted to 1 to 20 mole%, are subjected to gas-solid phase mixing in a fluidized bed reactor heated at 100 to 600° C. to obtain a highly hydration-resistant magnesia granule having a surface covered with a continuous and uniform coating of silica.

(2) A magnesia powder before granulation and a heated vapor of an organic silicate compound, the concentration of which has been adjusted to 1 to 20 mole%, are subjected to gas-solid phase mixing in a fluidized bed reactor heated at 100 to 600° C. to cover the surface of the magnesia particles with a continuous and uniform coating of silica. Then, this silica-coated magnesia powder is subjected to the above-mentioned granulation and heat treatment to obtain a highly hydration-resistant magnesia granule.

In the latter process, a coating of forsterite is formed on the surface of the magnesia granule through the reaction of the silica coating with magnesia during the heat treatment after granulation. This forsterite coating provides approximately the same hydration-resistance as that of the silica coating.

In the magnesia granule according to the present invention, the total content of uranium and thorium is preferably not higher than 10 ppb, and the particle size distribution is preferably such that particles of a size larger than 40 $\mu$m comprise less than 30% by weight, particles of a size of 1 to 40 $\mu$m comprise 60 to 90% by weight, and particles of a size smaller than 1 $\mu$m comprise less than 10% by weight.

According to the present invention, there is provided a magnesia granule containing very slight amounts of uranium and thorium, having a shape, particle size, distribution, and strength which make it suitable as a filler of a resin composition for sealing electronic parts, and having a high resistance to hydration, and a process for the production of such an excellent magnesia granule.

The present invention will be further illustrated by reference to the following non-limitative examples.

Example 1

A slurry was prepared by blending 40% by weight of a magnesia powder having an average particle size of 0.102 $\mu$m and produced by gas phase oxidation of a heated vapor of metallic magnesium with 60% by weight of ethanol in a ball mill for 24 hours. The slurry was spray dried on a spray dryer to obtain a granule having an average particle size of 20 $\mu$m. The particle size distribution of the granule was such that particles of sizes smaller than 1 $\mu$m comprised 0.9% by weight, particles of sizes of 1 to 40 $\mu$m comprised 93.6% by weight, and particles of sizes larger than 40 $\mu$m comprised 5.5% by weight.

The granule thus obtained was heat treated in an electric furnace at 1,500° C. for 1 hour to obtain a granule having a high strength.

Figure 2:
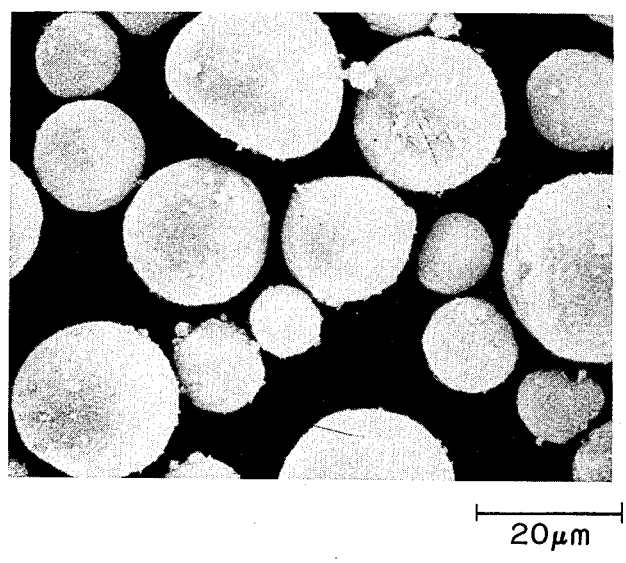
FIG. 2 is a micrograph of a dispersion obtained by ultrasonically dispersing the granular particles obtained after the heat treatment in Example 1 into ethanol.

FIGS. 1 and 2 show micrographs of the granule obtained after the heat treatment and a dispersion obtained by ultrasonically dispersing the granule after the heat treatment into ethanol. As is apparent from the micrographs, no thermal adhesion occurred between the granules because of the heat treatment, and the granular particles were not broken by ultrasonic dispersion in ethanol.

1 kg of the heat treated granule was charged into a fluidized bed reactor heated at 350° C. and heated vapor of tetraethoxysilane [Si(OC$_2$H$_5$)$_4$] at a concentration of 4.0% was supplied into the fluidized bed, using air as a carrier gas, at a gas flow rate of 500 ml/min to cover the surface of the granular particles with a uniform coating of silica. The amount of silica deposited was 1.21% by weight.

The hydration resistance test of the silica-coated granule was carried out in the following manner. Namely, 5 g of the granule was dispersed in 200 cc of distilled water, and the dispersion was then stirred for 192 hours, filtered, and dried at 105° C. for 5 hours. The ignition loss of the obtained powder was measured according to JIS R-5202 and identified by an X-ray diffractometer. The ignition loss was 0.1%, and no peak of Mg(OH)₂ was detected by the X-ray diffractometer. Further, uranium and thorium in the silica-coated granule were analyzed by fluorometry and spectrophotometry, respectively, and the total content of uranium and thorium was found to be 0.7 ppb.

Example 2

1 kg of a magnesia powder as used in Example 1 and having an average particle size of 0.102 $\mu$m was charged into a fluidized bed reactor heated at 350° C. and heated vapor of tetraethoxysilane at a concentration of 4.0% was supplied into the fluidized bed, using air as a carrier gas, at a gas flow rate of 500 ml/min to cover the surface of the particles with a uniform coating of silica. The amount of silica deposited was 1.35% by weight.

A slurry was prepared by blending 40% by weight of the magnesia powder with 60% by weight of ethanol in a ball mill for 24 hours. The slurry was spray dried on a spray dryer to obtain a granule having an average particle size of 20 $\mu$m. The particle size distribution of the granule was such that particles of sizes smaller than 1 $\mu$m comprised 0.7% by weight, particles of sizes 1 to 40 $\mu$m comprised 94.8% by weight, and particles of sizes larger than 40 $\mu$m comprised 4.5% by weight.

The granule thus obtained was heat treated in an electric furnace at 1,500° C. for 1 hour to obtain a granule having a high strength.

The identification of the granule by X-ray diffractometer detected the peaks of MgO and Mg₂SiO₄, to prove that silica on the magnesia particle surface had reacted with magnesia to be converted into forsterite.

The hydration resistance test of the silica-coated granule was carried out as described in Example 1. The ignition loss was 0.1%, and no peak of Mg(OH)₂ was detected by the X-ray diffractometer. Further, uranium and thorium in the silica-coated granule were analyzed by fluorometry and spectrophotometry, respectively, and the total content of uranium and thorium was found to be 0.7 ppb.

COMPARATIVE EXAMPLE 1

A granule was prepared in the same manner as described in Example 1 except that no silica coating was carried out. The hydration resistance test of the granule was carried out as described in Example 1. The ignition loss was 29.5%, and a strong peak of Mg(OH)₂ was detected by the X-ray diffractometer.

COMPARATIVE EXAMPLE 2

Figure 3:
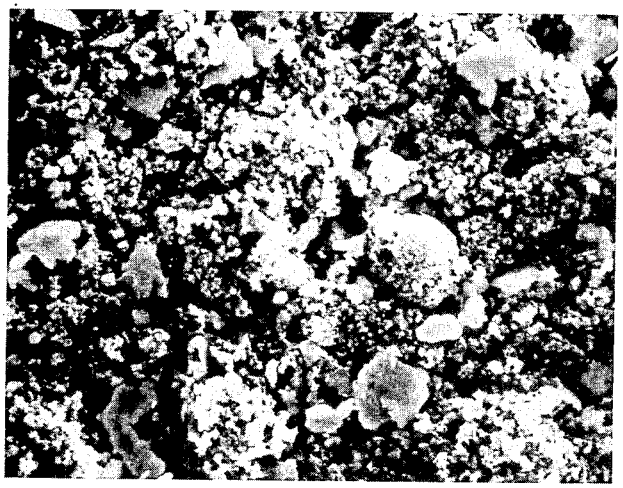
FIG. 3 is a micrograph of a dispersion obtained by dispersing the granular particles obtained in Comparative Example 2 into distilled water and stirring for 192 hours.

A silica-coated granule was prepared in the same manner as described in Example 1 except that the heat treatment was carried out at 1,300° C. for 1 hour, and the hydration resistance test of the granule was carried out as described in Example 1. The ignition loss was 3.2%, and no peak of Mg(OH)₂ was detected by the X-ray diffractometer, but the granular particles were broken during the stirring in distilled water, as seen from FIG. 3, to comprise 52.9% by weight of particles of sizes smaller than 1 $\mu$m.

Comparative Example 3

Figure 4:
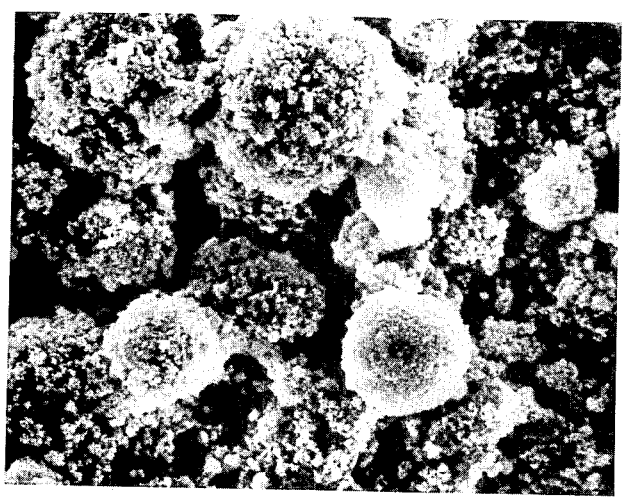
FIG. 4 is a micrograph of a dispersion obtained by dispersing the granular particles obtained in Comparative Example 3 into distilled water and stirring for 192 hours.

A silica-coated granule was prepared in the same manner as described in Example 1 except that the heat treatment was carried out at 1,300° C. for 5 hours, and the hydration resistance test of the granule was carried out as described in Example 1. The ignition loss was 0.9%, and no peak of Mg(OH)₂ was detected by the X-ray diffractometer, but the thermal adhesion between the granular particles was remarkable, as seen from FIG. 4, and was undesirable for use as a filler.

COMPARATIVE EXAMPLE 4

Figure 5:
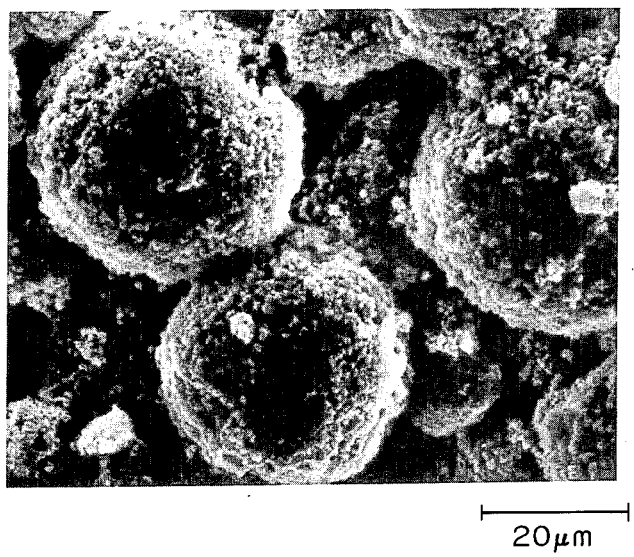
FIG. 5 is a micrograph of a dispersion obtained by dispersing the granular particles obtained in Comparative Example 4 into distilled water and stirring for 192 hours.

A silica-coated granule was prepared in the same manner as described in Example 1 except that the heat treatment was carried out at 1,750° C. for 30 minutes, and the hydration resistance test of the granule was carried out as described in Example 1. The ignition loss was 0.1%, and no peak of Mg(OH)₂ was detected by the X-ray diffractometer, but the thermal adhesion between the granular particles was remarkable, as seen from FIG. 5, and thus was undesirable for use as a filler.

We claim:

1. A heat treated magnesia granule of essentially spherical shape and of a strength suitable for use as a filler of a resin composition for sealing electronic parts, said granule having a surface covered with a continuous and uniform coating of material selected from the group consisting of silica and forsterite, and wherein the particle size distribution of said granule is such that particles of sized larger than 40 $\mu$m comprise less than 30% by weight, particles of sized of 1 to 40 $\mu$m comprises 60 to 90% by weight, and particles of sizes smaller than 1 $\mu$m comprise less than 10% by weight, and wherein said heat treatment is conducted at a temperature in a range from 1400° C. to 1700° C. for not more than 1 hour.

2. A magnesia granule according to claim 1, wherein the surface is covered by a silica coating.

3. A magnesia granule according to claim 1, wherein the surface is covered by a forsterite coating.

4. A magnesia granule according to claim 1, wherein a total content of uranium and thorium is not higher than 10 ppb.

* * * * *